United States Patent [19]

Roush

[11] 4,120,021

[45] Oct. 10, 1978

[54] COOLING SYSTEM FOR ELECTRONIC ASSEMBLY

[75] Inventor: Maurice Dean Roush, Chippewa Falls, Wis.

[73] Assignee: Cray Research, Inc., Chippewa Falls, Wis.

[21] Appl. No.: 701,017

[22] Filed: Jun. 30, 1976

[51] Int. Cl.² ............................................. H05K 7/20
[52] U.S. Cl. ................................. 361/388; 361/385; 361/386; 165/80
[58] Field of Search .................. 165/80; 361/380, 381, 361/386, 382, 385, 388, 395, 412, 415; 174/15 R, 16 HS; 340/173 R

[56] References Cited

U.S. PATENT DOCUMENTS

| | | | |
|---|---|---|---|
| 3,334,684 | 8/1967 | Roush | 361/385 |
| 3,631,325 | 12/1971 | Wenz | 361/386 |
| 3,648,113 | 3/1972 | Rathjen | 361/382 |
| 3,865,183 | 2/1975 | Roush | 361/385 |

Primary Examiner—Gerald P. Tolin

Attorney, Agent, or Firm—Merchant, Gould, Smith, Edell, Welter & Schmidt

[57] ABSTRACT

The chassis for an electronic assembly includes a plurality of cooling bars which are mounted parallel to each other and spaced apart to receive electronic assembly modules. The cooling bars have internal passages for the flow of coolant, and the bars have a plurality of slots formed in the sides thereof facing adjacent cooling bars. The electronic assembly module in the preferred embodiment comprise a pair of circuit board assemblies with a heat conducting plate sandwiched therebetween, and extending slightly beyond the margins of the circuit boards to form heat conducting flanges along opposing sides of the module. The circuit modules are positioned between adjacent cooling bars with the heat conducting flanges fitting in the slots of the cooling bars. Clamping means force the heat conducting flanges into intimate thermal contact with the slots of the cooling bars. In a preferred embodiment, the clamping means comprises a plurality of wedge blocks which are cammed into the flanges.

7 Claims, 15 Drawing Figures

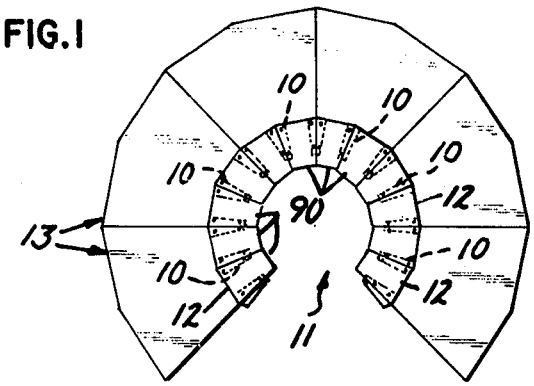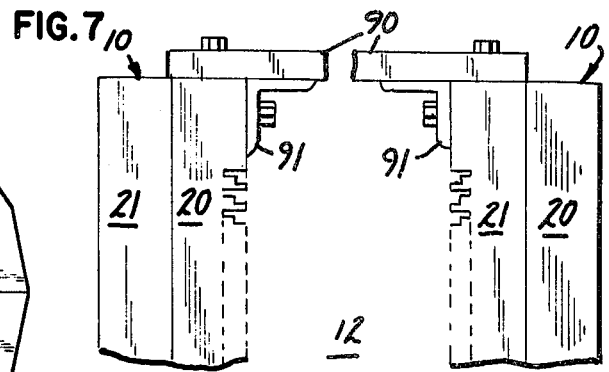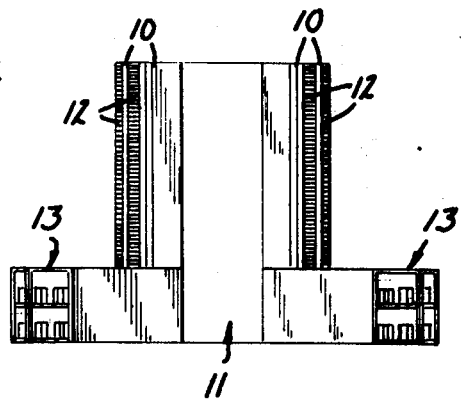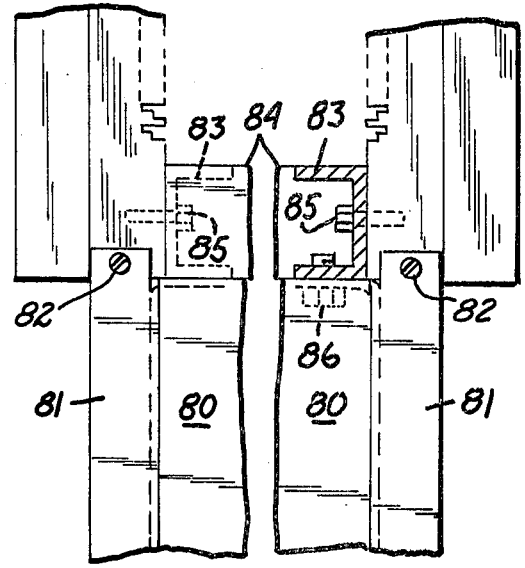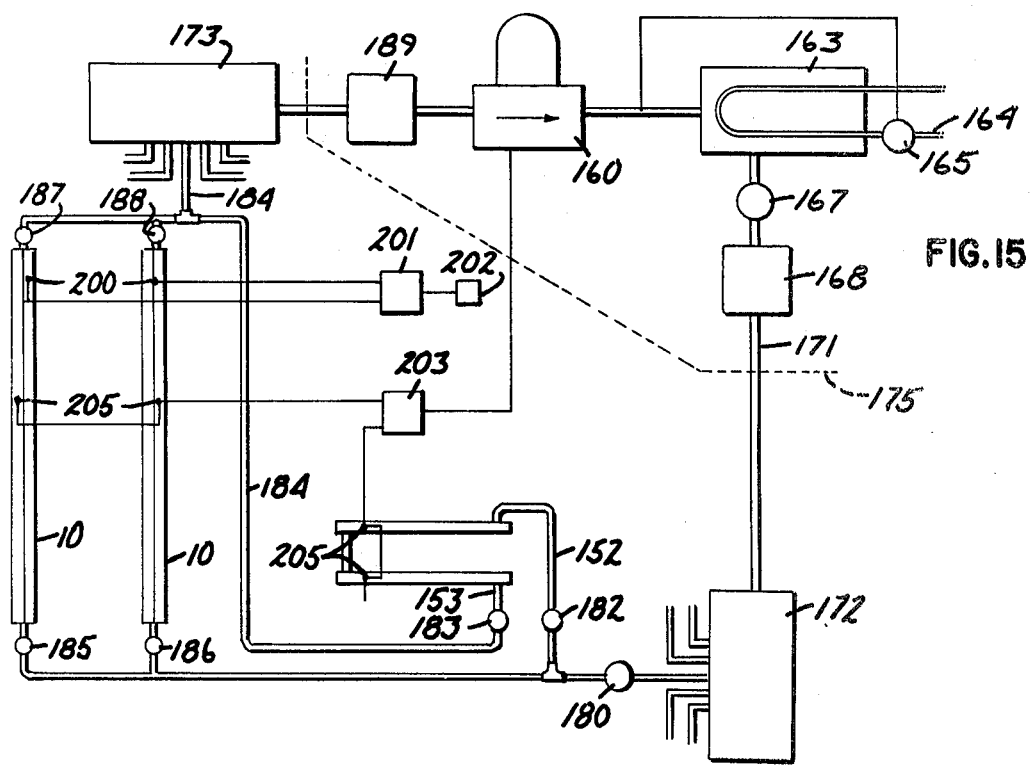

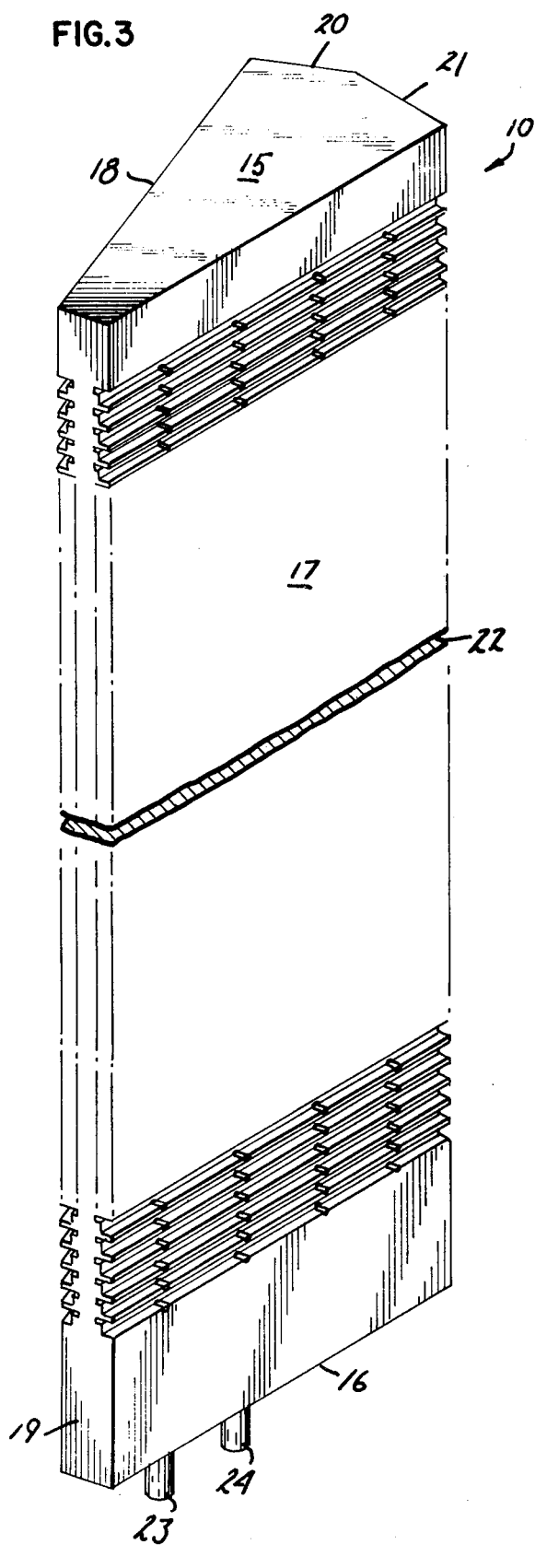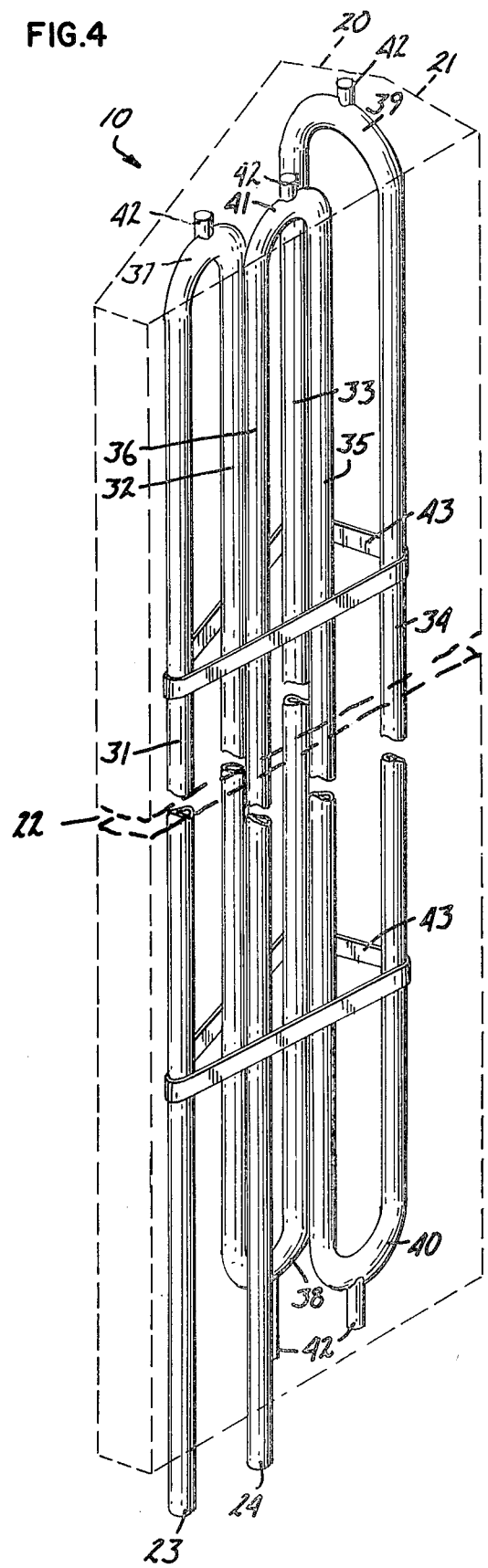

COOLING SYSTEM FOR ELECTRONIC ASSEMBLY

BACKGROUND OF THE INVENTION

The present invention pertains generally to the field of cooling systems for electronic apparatus. In particular, the invention is believed to have its greatest applicability in the field of high speed digital electronic computers, and the description herein of the presently preferred embodiment of the invention illustrates the use of the invention in the computer field.

The supplying of adequate cooling to electronic equipment is a constantly recurring design problem which has prompted many solutions and cooling techniques over the years. When forced air cooling failed to provide adequate heat transfer, the circulation of liquid coolants was adopted. When faced with still higher heat loads, designers have turned to refrigeration cycle equipment, with the evaporator unit being located within the chassis area adjacent the electronic modules or components.

Ever increasing developments in the field of electronic circuitry miniaturization have not alleviated thermal design problems in electronic equipment. If anything, further miniaturization has had the opposite effect, because the smaller size of components and the combining of multiple components in integrated circuits have allowed a greater number of devices to be packed into a smaller physical area. The combined heat dissipation of thousands of miniature circuits packed into a small physical area can easily exceed the heat transfer capabilities of cooling systems which were successful with prior art electronic implementations.

This thermal problem is most intensely felt in the field of high speed electronic digital computers. Increasing sophistication in the complexity and data handling size of computers has greatly increased the number of required circuit modules for logic and memory. Further, for reasons related to providing a desired high speed of operation, the type of circuitry used in high speed computers is not the circuit type having the lowest heat dissipation. Further complicating the problem is the fact that the short clock periods required for high speed data processing place constraints on the physical length of connecting wires within the central processor. This in turn implies that the greater number of circuits required for logic and memory in the largest and fastest machines must be packaged with a higher circuit packaging density than was the case with slower and less complex prior art machines.

In the face of these thermal problems, prior art refrigeration cooling systems for computers have not proved adequate. One example of a prior art refrigeration cycle electronic cooling system is shown in U.S. Pat. No. 3,334,684. In that patent, cooling bars having internal refrigerant flow paths are spaced along a chassis, and each cooling bar has a plurality of transverse aluminum plates. These plates define individual compartments therebetween, and the circuit modules are placed therein. Although the type of construction represented in prior U.S. Pat. No. 3,334,684 provides adequate cooling up to a certain point, it will not provide the quantity of heat transfer required in newer computer designs. One problem with the construction shown in the prior patent is the relatively large air gap between the circuit module and the aluminum plates. A second problem is the relatively long heat conducting path from the extremities of the aluminum plate down to the cooling bar which contains a refrigerant flow. Yet another problem is the difficulty of inserting and replacing individual modules.

SUMMARY OF THE INVENTION

The present invention overcomes these and other problems existing with prior art electronic cooling systems by providing a more efficient and higher capacity heat transfer from the circuit modules to the refrigeration system. According to the present invention, there is provided a plurality of cooling bars associated with the chassis of the electronic apparatus, the cooling bars having a plurality of slots formed therein. The cooling bars are positioned adjacent one another and spaced apart a distance according to the width of the circuit modules. The circuit modules are provided with heat conducting flanges along the sides thereof which are adapted for fitting into the slots of adjacent cooling bars in heat conducting relation therewith. Heat thus generated within the electronic modules is conducted through the flanges to the cooling bars, and means associated with the cooling bars are provided for removing heat therefrom.

In a preferred embodiment, the modules each comprise a heat conducting plate sandwiched between a pair of electronic circuit board assemblies. The means which attach the circuit board assemblies to the conducting plate, which can be for example nuts and bolts, include means such as a thin spacing washer, for establishing and controlling a minimum width air gap between the circuit board assemblies and the conducting plate for maximum heat transfer over the entire area of the circuit boards and plate. Additionally, the attaching means can also conduct heat from the circuit boards to the conducting plate.

In the preferred embodiment, the heat conducting flanges are formed by opposite edges of the heat conducting plate which is made larger than the circuit boards so as to extend beyond the edges thereof to form the flanges.

Clamping means may be provided to clamp the flanges into tighter heat conducting contact with the slots. In a preferred embodiment, the clamping means comprises a plurality of camming surfaces attached to the face of the cooling bar adjacent the slots, and wedge blocks having second camming surfaces slidably positioned on the first camming surfaces adjacent the slots. Means are provided for moving the wedge blocks along the camming surfaces thereby forcing the wedge blocks against the heat conducting flanges and the flanges against the sides of the slots for maximum heat conducting contact.

BRIEF DESCRIPTION OF THE DRAWINGS

FIG. 1 is a view in top plan of a computer chassis utilizing the cooling system of the present invention;

FIG. 2 is a view in side elevation thereof;

FIG. 3 is a detailed perspective of a cooling bar according to the present invention, portions thereof broken away;

FIG. 4 is a view in perspective of the evaporator coil used within the cooling bar of FIG. 3;

FIG. 7 is a detailed elevational view showing attachment of cooling bars to other chassis components;

FIG. 15 is a schematic diagram of a refrigeration system for use with the present invention.

DETAILED DESCRIPTION OF THE PREFERRED EMBODIMENT

Figure 6:
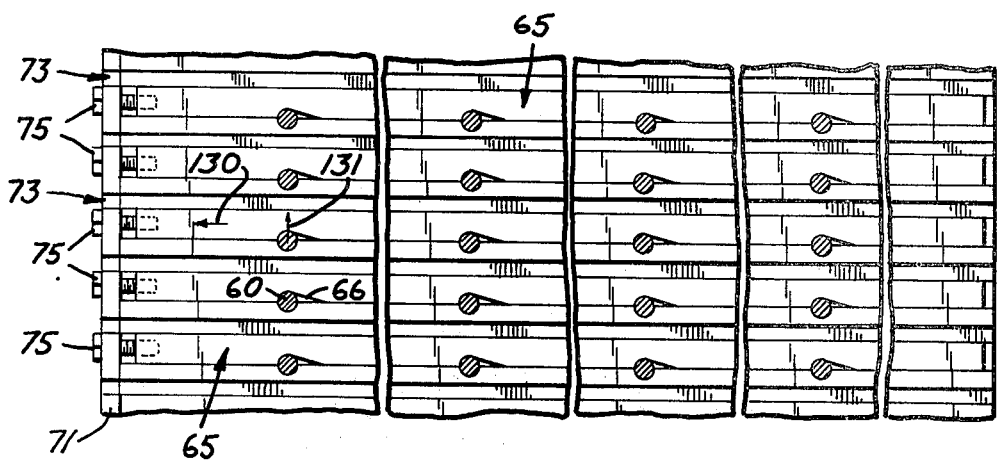
FIG. 6 is a view in side elevation of the face of a cooling bar in an assembled position, portions thereof being broken away.

The presently preferred embodiment of the cooling system according to the present invention is illustrated herein as applied to a high speed digital computer wherein the chassis or cabinet for holding the modules is formed in a semi-cylindrical configuration. However, it will be understood that the cooling system under the present invention is equally applicable to other configurations of cabinets or chassis, for example, rectangular or otherwise.

FIGS. 1 and 2 are top and side views respectively of a central processor of a computer utilizing the cooling system of the present invention. The chassis includes a plurality of vertically disposed cooling bars, a few of which are indicated by reference numeral 10. Cooling bars 10 are arranged vertically and spaced apart from each other so that a semi-cylindrical upper chassis configuration is formed, with the individual cooling bars radiating outwardly from the center like the spokes of a wheel. A large sector 11 is left open for access to the inside of the chassis.

Pairs of cooling bars 10 define banks therebetween for receiving a plurality of circuit modules, generally indicated by reference numeral 12. A plurality of power supply cabinets are positioned around the base of the cylindrical portion of the chassis defined by the cooling bars. In the embodiment shown, six such power supply cabinets are shown, two of which are indicated with reference numeral 13.

In FIG. 3, the cooling bars are shown in greater detail. The cooling bar is essentially an elongated aluminum casting with stainless steel refrigerant tubing inside it, having a wedge-shaped cross section, and having machined faces for receiving the circuit modules and other fittings as explained hereinafter. In FIG. 3, the typical cooling bar has a wedge-shaped top 15, a bottom 16, a pair of flat faces 17 and 18, a narrow back portion 19, and a pair of front sides 20 and 21 which meet at a slight angle on the center line of the cooling bar. Face 18, bottom 16, and front sides 20 and 21 are not visible in the orientation of the cooling bar shown in FIG. 3, but are indicated by reference numerals along the edges thereof. The cooling bar is drawn broken at 22 so as to accommodate the length of the cooling bar in the space for the drawing.

FIG. 4 shows the cooling bar outlines indicated in broken line. This phantom view shows the positioning of the stainless steel refrigerant tubing within the cooling bar. Reference numerals 23 and 24 indicate the inlet and outlet of the tubing, although it will be appreciated that either one could be used for the inlet or outlet as may be desired. The refrigeration tubing within the cooling bar comprises the evaporator portion of a refrigeration system.

The evaporator comprises a number of straight sections 31–36, which are interconnected in series fashion by a number of bend portions 37–41 to form a continuous refrigerant coil or circuit. As seen in broken lines also in FIG. 12, the straight lengths and bend portions are orientated to distribute the various sections of the pipe as uniformly as possible throughout the interior of the cooling bar for maximum cooling efficiency. A number of stubs 42 are welded into the bend portions of the tubing and these extend to the outer dimensions of the cooling bar. Stubs 42 are used to hold the tubing assembly in the proper position during the casting operation. For similar reasons, a pair of bands 43 may be wrapped around the tube bundles to assist in maintaining their orientation during the casting process. After the aluminum has been cast in and around the tubing to form the cooling bar, the stubs are of no further use. The rough casting finish of the cooling bar must then be machined to provide the necessary fittings as explained hereinafter.

Figure 5:
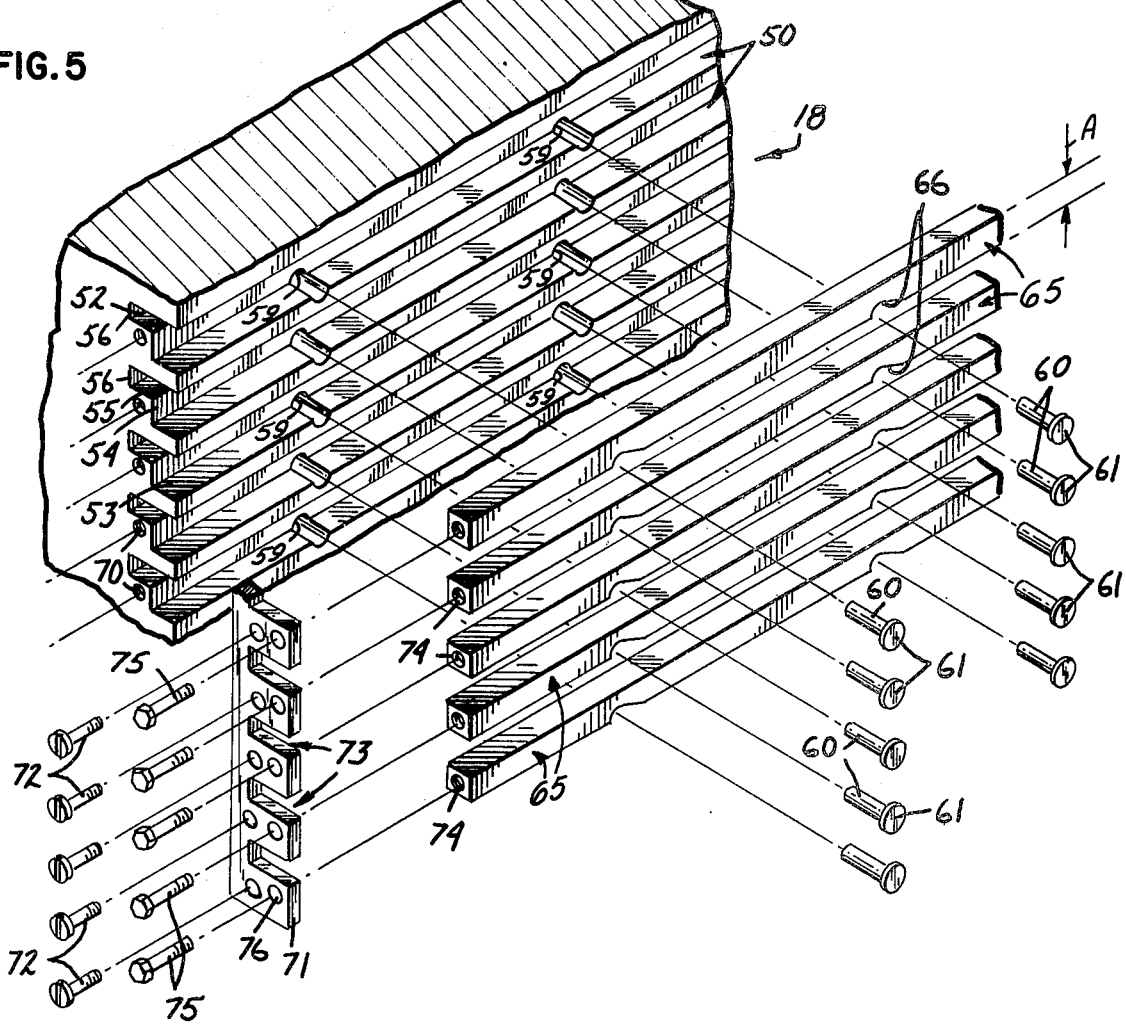
FIG. 5 is an exploded fragmentary detail of a face of the cooling bar of FIG. 3, showing the slots and clamping means according to the present invention.

Faces 17 and 18 of the cooling bar are machined smooth and flat in the preferred embodiment, and a plurality of module receiving slots 50 are machined in the two faces. The details of the slots are best seen in FIG. 5. FIG. 5 is an enlarged fragmentary view of a portion of a cooling bar 10. Front side 20 and face 18 are visible in the orientation of FIG. 5. The individual slots 50 are stepped in cross section. All slots are identical, and a detailed explanation of a representative slot with respect to FIG. 5 is as follows. A given slot is formed between two adjacent land areas of face 18 which are left when the slot is machined. Sides 52 and 53 form the outer or wider portion of the slot, with side 52 being deeper to also form part of the inner or deeper part of the slot. Wall 54 forms the step of the slot, and wall 55 which is opposite the inner portion of wall 52 defines the deepest portion of the slot. Reference numeral 56 indicates the bottom of the slot.

A plurality of columns of holes are drilled in the face having the slot for receiving camming pins. Reference numeral 59 indicates one of the holes. The hole is centered on the junctions between wall 53 of the slot and step 54 of the slot. Thus, the upper portion of the hole 59 is a semi-cylindrical channel. Reference numeral 60 is the shank of the camming pin, and reference numeral 61 is the head thereof. These pins are made of stainless steel and are press fitted into the plurality of holes 59, with the portion of the pins adjacent their heads being received in the semi-cylindrical channels. The holes and pins are arranged in vertical columns so that there are multiple pins in each slot. As seen in the side view of FIG. 6, each slot has four pins so there are four columns of pins along each of the faces 17 and 18 of the cooling bar in the preferred embodiment.

Again referring to FIG. 5, a plurality of wedge blocks 65 are provided, one associated with each slot 50. Wedge block 65 is essentially an elongated bar of square or rectangular cross section. A plurality of camming surfaces 66 are formed in the bottom of the wedge block spaced according to the spacing of the columns of camming pins. Each camming surface has an inclined surface formed at a small angle to the bottom of the wedge block. At the maximum depth of the camming surface, it connects by radius back to the bottom surface of the wedge surface. Dimension A of the wedge block 65 preferably corresponds to the width of step portion 54 of the slot. When assembled, each wedge block 65 fits into the wide upper portion of a slot 50, with the bottom of the wedge block adjacent side 53 of the slot, one side of the wedge block adjacent step 54 of the slot, the top side of the wedge block adjacent and coplanar with side 55 of the slot, and the other side of the wedge block being held in place by the heads 61 of the camming pins 60, which fit in the deep portions of camming surfaces 66.

A plurality of threaded holes 70 are tapped in the front side 20 and 21 of the cooling bars as best seen in FIG. 5. A jack strip 71 extends along the edges of the slots along the front sides 20 and 21 of each cooling bar, and is held in place by a plurality of bolts 72 which thread into tapped holes 70. Jack strip 71 has a plurality of cutouts 73 which match the deepest portion of each slot 50 bounded by bottom 56 and sides 52 and 55.

The portions of jackstrip 71 between adjacent cutouts 73 are aligned with the ends of the wedge blocks 65 when assembled. The ends of each wedge block 65 which face a front side 20 or 21 of the cooling bar each have a tapped hole 74. A plurality of clearance holes 76 are provided in alignment with the hole 74 at the end of the wedge block, and a plurality of jack screws 75 pass through clearance holes 76 and are threaded into tapped holes 74. These jack screws are used for clamping the circuit modules into the slots in the cooling bars for maximum heat transfer, as explained more fully hereinafter.

Referring now to FIG. 7, one possible means for mechanically tying the cooling bars into the chassis is indicated. In FIG. 7, a pair of cooling bars 10 are shown in front view with their front sides 20 and 21 visible in the view. Chassis support or base frame 80 includes flanges 81 to which the cooling bars are bolted by means of bolts 82. A large tapped hole can be provided at the base of the cooling bars for this purpose. Additional frame channel members 83 and a cross brace member 84 can be likewise provided. Channel members 83 can be bolted to the cooling bars by means of bolts 85 which also fit into tapped holes. The channel members can also be bolted as at 86 to the chassis support or base frame 80.

At the upper ends of the cooling bar, a top plate 90 bridges adjacent cooling bars and is attached thereto with the aid of angle brackets 91, which may be bolted into tapped holes in the cooling bars also.

It will be appreciated that the top plate 90 and the chassis support members and channel frames shown in FIG. 7 are repeated between each adjacent pair of cooling bars all the way around the chassis. It will further be appreciated that the specific chassis frame members shown in FIG. 7 are only illustrative, and that many other types of specific chassis or frame configurations could be used to support and position the cooling bars. Since the cooling bars represent a great deal of weight, being solid cast aluminum, the subframe must be designed to handle this substantial weight. The most efficient chassis or frame design would be one such as shown in FIG. 7 which uses the inherent strength of the cooling bars as a structural part of the chassis itself.

Figure 8:
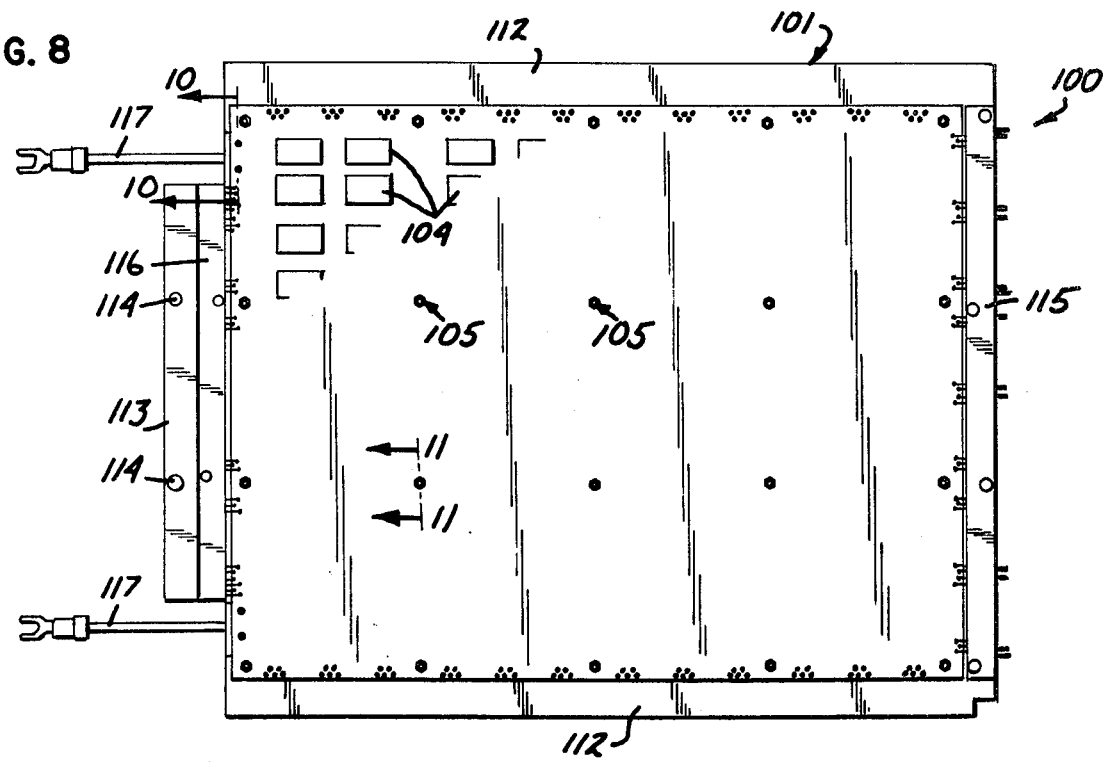
FIG. 8 is a plan view of a circuit module according to the present invention.
Figure 9:
FIG. 9 is a side elevational view of a circuit module.
Figure 10:
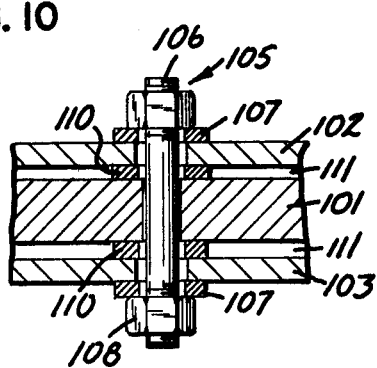
FIG. 10 is an enlarged sectional view taken generally along line 10—10 of FIG. 8.
Figure 11:
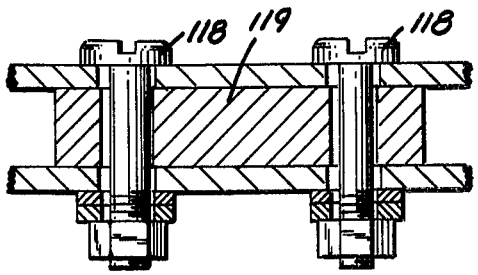
FIG. 11 is an enlarged sectional view taken generally along line 11—11 in FIG. 8.

The electronic circuit module for use with the cooling system of the present invention is illustrated in FIGS. 8 and 9, and in enlarged sectional FIGS. 10 and 11. In the preferred embodiment module 100 comprises a sandwich structure with a heavy copper heat conducting plate 101 at its center. A pair of electronic circuit boards are attached to the heat conducting plate, one on either side. In FIG. 8, reference numeral 102 indicates one electronic circuit board assembly. The circuit boards themselves may be of any type of construction. In the preferred embodiment multiple layer printed circuit boards are used with signal foil runs on the outer surfaces and inner layers for power supply and ground supplies. A plurality of integrated circuits and other electronic components as required are mounted according to known printed circuit board techniques on the circuit boards. A few components are indicated for illustrative purposes at reference numeral 104. Since the printed circuit boards are preferably mounted extremely close to the heavy copper plate 101, it is important that all circuit components be mounted on the sides of the circuit boards away from the sides adjacent plate 1. As seen in FIG. 9, the heavy heat conducting plate 101 is positioned between the pair of circuit board assemblies 102 and 103. The circuit board assemblies and the heat conducting plate are held together by a plurality of threaded stud and nut assemblies indicated by reference numeral 105. These assemblies may be spaced at intervals throughout the module, as indicated in FIG. 8, as may be required for strength.

As seen in FIG. 10, stud 106 passes through clearance holes which are provided in both boards 102 and 103, and in heat conducting plate 101. Washers 107 are placed over the stud on the outside of each circuit board and the assembly is held together by a pair of nuts 108.

A pair of spacer washers are provided on either side of heat conducting plate 101 and the adjacent circuit board. Washers 110 serve multiple purposes. One function is to provide a controlled minimum spacing between the circuit boards and the heat conducting plate. In FIG. 10, the established air gaps are indicated by reference numeral 111. Another function is to establish a ground connection from the circuit boards to the heat conducting plate. The circuit boards may be made with a conductive pad under each washer. These pads are plated through to both sides of the board and they may additionally make connection with a central ground plane layer of the multilayer board. The contact from these pads through spacer washers 110 to plate 101 establishes a ground for the entire system, since plate 101 is subsequently clamped to the cooling bar of the chassis. In the preferred embodiment spacer washers 110 are gold plated and have serrated edges to ensure good electrical contact and to prevent unwanted corrosion which might otherwise degrade the ground contact with the passage of time.

Referring again to FIG. 8, plate 101 is made large enough so that the side portions extend beyond the sides of the circuit boards so as to form flange portions 112. These flanges fit into slots 50 of the cooling bars. At the back end of the module an electrical connector 115 may be provided, and a test point connector 116 may be provided at the front of the module. A portion of plate 101 extends forwardly of the circuit boards, as indicated at 113, and a pair of holes 114 provided therein are used to assist in pulling the module from the chassis. A pair of lead wires 117 may also be provided at the front of the module for supplying power supply voltages to the electronic circuits.

FIG. 11 is an enlarged sectional detail showing a pair of bolts 118 and associated nuts and lock washers for attaching a module bus assembly 119 which in turn connects to the appropriate power supply plane layer of the circuit boards. Power leads 117 are soldered to bus assemblies 119.

Figure 12:
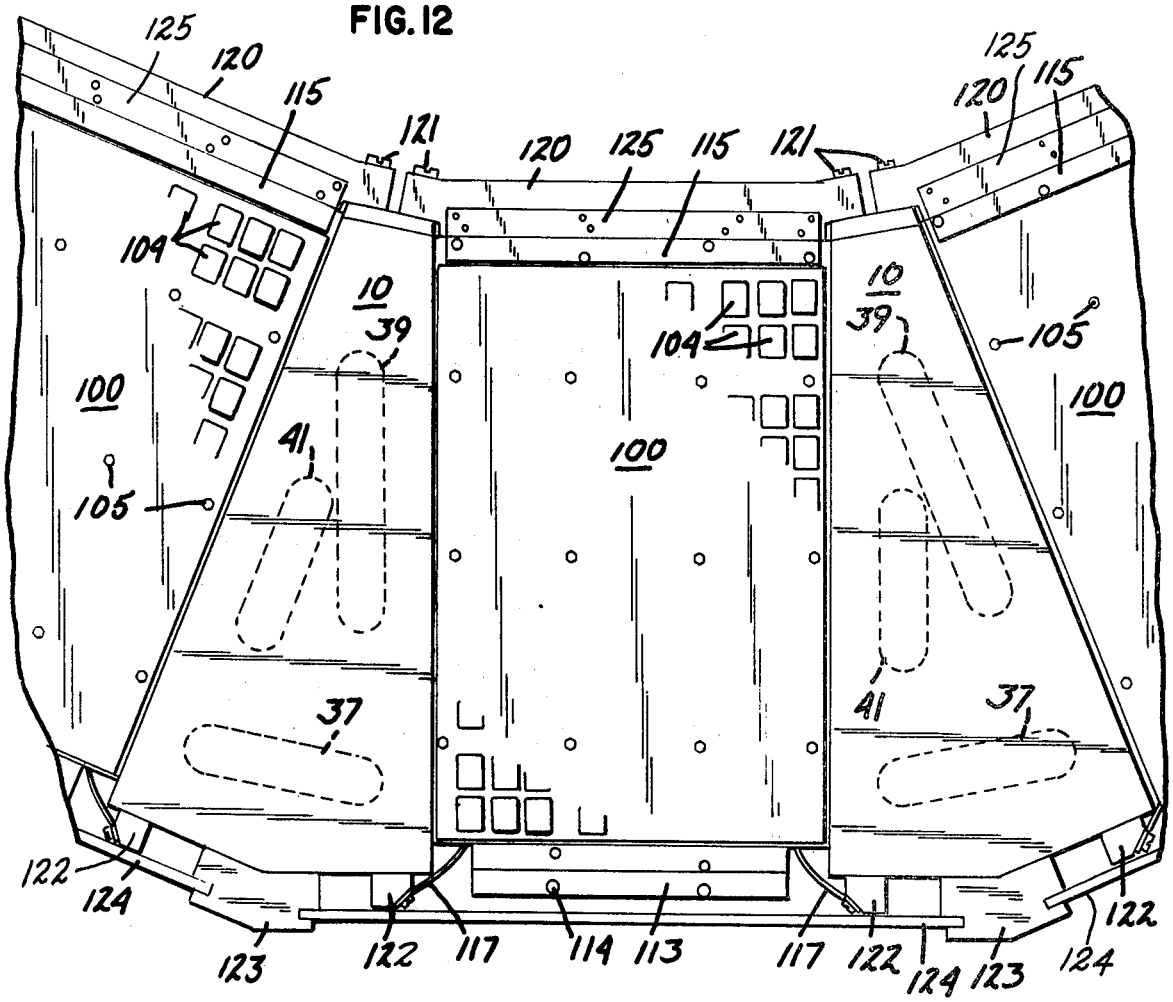
FIG. 12 is a view in top plan of a pair of adjacent cooling bars with circuit module positioned therebetween.

FIG. 12 shows an individual circuit module 100 in a module bank between adjacent cooling bars 10. Modules in adjacent module bank are also shown fragmentarily on the other sides of the cooling bars. A plurality of connector mounting strips 120 are connected between adjacent cooling bars by bolts 121 which thread into tapped holes in end 19 of the cooling bars.

Vertically extending bus bars 122 are attached to the front sides of the cooling bars by means of insulators and nylon or steel-cored nylon screws. Power leads 117 are connected to the bus bars by set screws. A front trim extruded piece 123 is attached to the front of each cooling bar. Decorative front panel members 124 may be mounted in slots in the front trim pieces 123.

Figure 13:
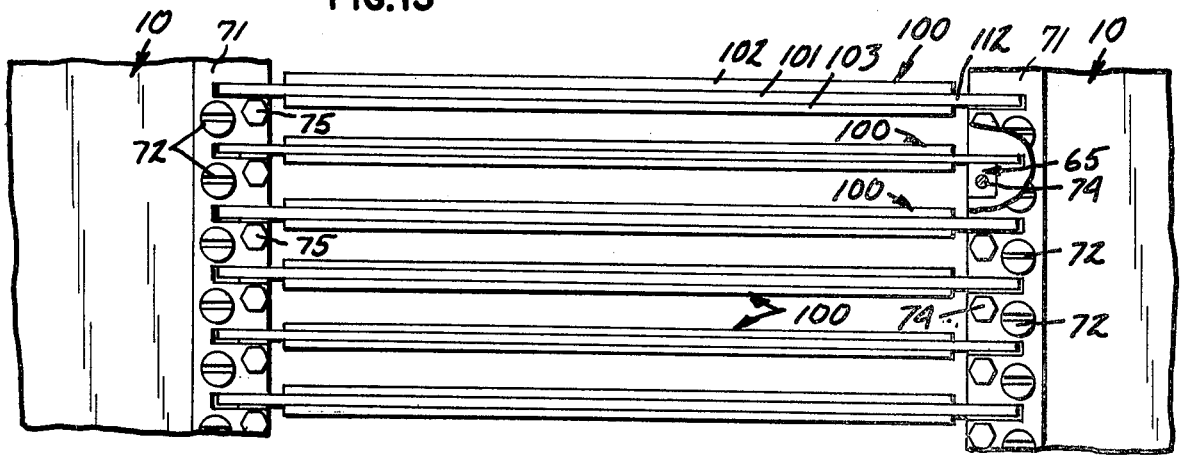
FIG. 13 is a frontal view of a pair of adjacent cooling bars with a plurality of circuit modules positioned therebetween.

As seen in FIG. 13, the plurality of circuit modules 100 are positioned into a module bank between adjacent cooling bars so that the flanges 112 of the modules fit into the slots 50 which are machined into the adjacent faces of the cooling bars. As the modules are being slid into place the slots act as guides for the flanges. Once in place, connector 115 at the back of the module meets with a mating connector 125 which is attached to the connector mounting strip 120. The heat conducting flanges of the modules are then clamped into place in the slot by means of the wedge blocks and the jack screws 75.

As best seen in FIG. 6, the tightening of a jack screw 75 causes a wedge block to move toward the front of the cooling bar, to the left in FIG. 6 as indicated by arrow 130. As the wedge block moves towards the front, camming surface 66 rides up over the camming pins 60, forcing the wedge blocks increasingly in an upward direction as indicated by arrow 131. This pushes the wedging block tightly into the flange of the module. In FIG. 13 a portion of the jack screws stip is broken away to show a front view of a wedge block 65 pulled tightly up beneath the heat conducting flange of the module with the upper surface of the module flange being held in tight heat conducting contact with the upper wall 52 of the slot 50.

Figure 14:
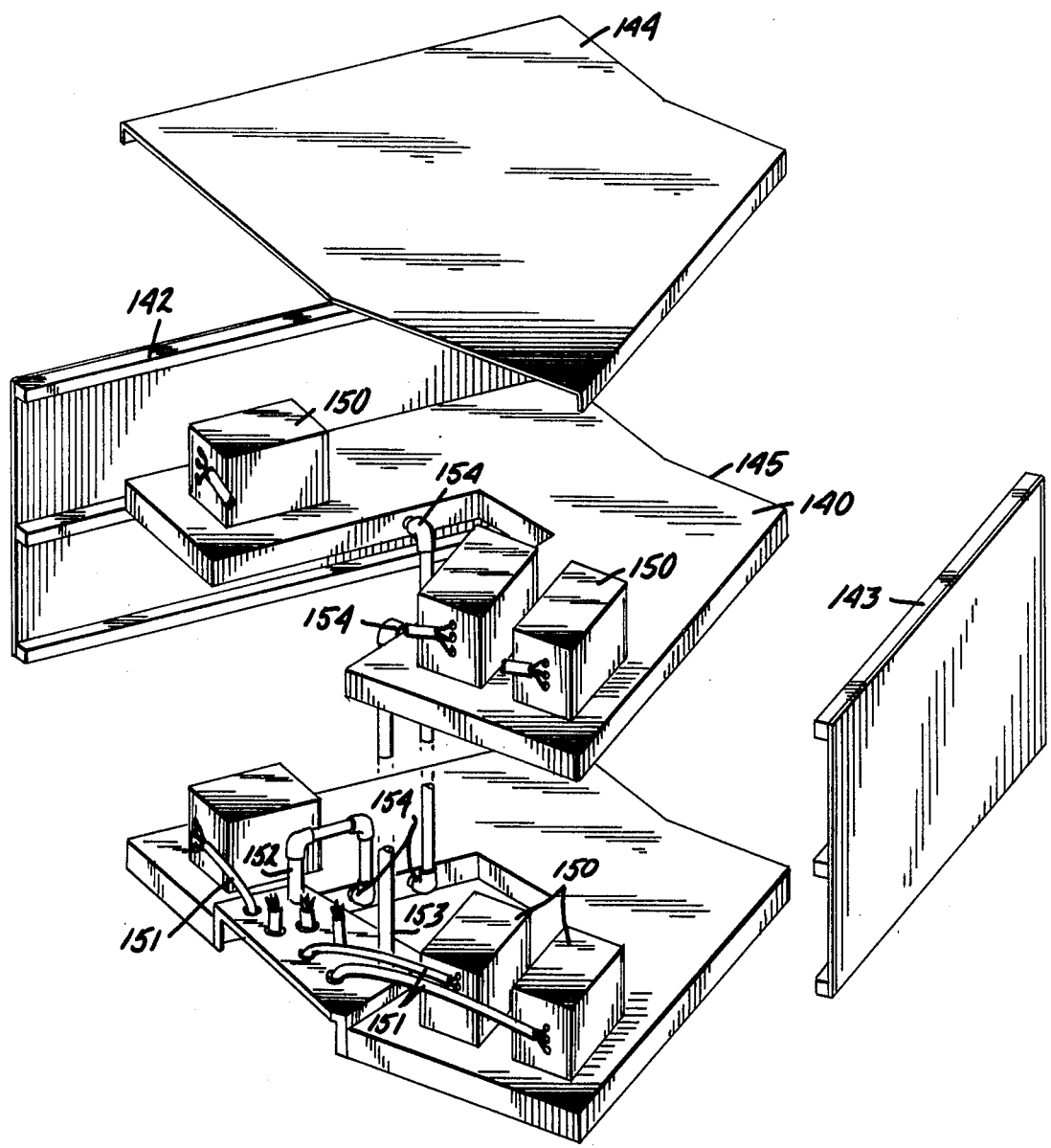
FIG. 14 is an exploded diagrammatic representation of a power supply cabinet.

Referring now to FIG. 14, one of the power supply cabinets 13 of FIG. 1 is shown in exploded view. The power cabinet includes a pair of cooled shelves 140 and 141, a pair of side panels 142 and 143, and a top panel 144. FIG. 14 is only schematic in nature and it will be appreciated that additional braces or mounting brackets may be desired for added rigidity in assembling the power cabinet. As seen in FIGS. 1 and 2, the individual power supply cabinets butt up against the central portion of the chassis, and the inner edges 145 and 146 of cooling shelves 140 and 141 may be connected to the base frame chassis members indicated in FIG. 7 which also support the cooling bars. The power supplies, which are indicated by reference numeral 150, are preferably bolted directly to the cooling shelves. Power cabling is preferably brought up from beneath the floor from a remotely positioned power distribution cabinet. Several such cables are indicated by reference numeral 151. Refrigerant pipes 152 and 153 may also be brought out through the floor, and these are connected to refrigerant fittings 154 which protrude from the edges of the coolinghelves.

The cooling shelves are similar to the cooling bars in that they are cast aluminum and contain internal stainless steel refrigerant tubing which describes a zigzag path around the shelf area from one fitting 154 to the other. The refrigerant path can be connected in series through the refrigerant tubing in the two shelves by external connections. Although not shown in FIG. 14, power lead may extend from the power supply towards the cooling bars and connect to the bus bars 122 positioned therealong. A single power carbinet, such as shown in FIG. 14, is designed to supply the necessary operating power for two module banks in the central chassis. There are thus six power cabinets and twelve module banks. This configuration allows positioning of the power supplied close to their module banks so that conductor lengths from power supply to module including the bus bar can be kept to a minimum.

The twelve module banks require thirteen cooling bars. The two extreme cooling bars are made the same as the remaining eleven, except that the machine finishing and forming of slots need be done on only the face. Also, a smaller diameter tubing is used to form the refrigerant paths therein prior to the casting process, since the end cooling bars are subject to only half the thermal load of the interior cooling bars.

Any conventional type of refrigeration system can be used to supply refrigerant to the cooling bars and cooling shelves of the present invention. One such system is shown schematically in FIG. 15 in which reference numeral 160 is the compressor. Compressed refrigerant flows via a conduit 161 to a water-cooled condenser 163. Cooling water for the condenser is supplied by a water line 164 which operates through a pressure controlled regulating valve 165. Condensed refrigerant from the condenser flows through a sight glass 167, a filter-drier 168, and a conduit 171 to a distributing manifold 172.

Broken line 175 separates the components which are associated with the condensing unit and those associated with the computer. Those components associated with the computer are in the computer chassis itself, while the components associated with the condensing unit can be positioned a considerable distance therefrom, for example, in a basement or in an adjacent utility room in a building. The necessary connections to the computer can be brought up through the floor beneath the computer chassis.

Distributor 172 is a liquid manifold which distributes the refrigerant to the plurality of refrigerant circuits in the computer. One such circuit is shown in FIG. 15, and branches for additional circuits from distributor 172 and back to suction manifold 173 are indicated. The circuits shown include a solenoid valve 180 and a conduit 181. One path branches from conduit 181 to an expansion valve 182, which connects through conduit 152 to cooling shelves 140 and 141 for one power supply cabinet. The return line through conduit 153 and back pressure valve 183 returns through conduit 184 to the suction manifold 173.

Conduit 181 also supplies liquid refrigerant through a pair of expansion valves 185 and 186 to a pair of cooling bars 10 associated with the same sector of the chassis as the power supply which is cooled on the same refrigerant circuit. The evaporated refrigerant from the cooling bars passes through back pressure valves 187 and 188 to conduit 184 and the suction manifold 173. Although FIG. 15 indicates the refrigerant from the cooling bars at the top thereof, this is only for convenience in the layout of the drawing; both the input and exhaust for the cooling bars are preferably made at the bottom as indicated in FIG. 3. This cuts down on the length of exposed refrigeration system plumbing which might otherwise interfere with wiring paths in the central area of the computer chassis. Evaporated refrigerant returns from manifold 173 through filter-drier 189 to compressor 160.

A warning system is provided in the preferred embodiment to monitor the cooling system for protection of the machine in case of failure. The primary temperature sensing is done by a thermistor attached to each cooling bar, preferably near the top thereof. In FIG. 15 reference numeral 200 indicates thermistor on the cooling bars which are connected by leads to a scanner 201. The output of the scanner goes to an alarm unit 202 and to a shutdown sequencer 203. As a backup system, each cooling bar has a thermostat as do the cooling shelves, which are indicated by reference numeral 205. All thermostats are connected together in series. An additional sensing line 206 connects from the condenser unit to the warning system.

In operation, the scanner continually scans each of the thermistors 200 and indicates an alarm when a temperature of 85° F. is reached. A time delay is also initiated which will eventually lead to the shutdown of the system, if the high temperature persists. The series connected thermostats 205 are set for a higher temperature, for example 92° F. They serve as a backup against any failure in the scanner. If any of the thermostats should open, a shutdown sequence will be initiated. Also, if a condensing unit should shut down, the system will be shut down.

Heat generated within the body of the integrated circuits is conducted to the heavy copper heat conducting plate 101 by three paths. The main path is from the body of the integrated circuit where the heat is generated to the circuit board by direct contact, then through the small air gaps 111 by convection to plate 101. Another heat path is through the integrated circuit leads to the back side of the circuit boards, then across the air gap to the copper. A third path is from the components which connect to ground, through the spacer washers 110 directly to the copper plate 101. The entire surface of the circuit board and the entire surface of the heat conducting plate both act as radiators. Since they are separated by only a very small gap, the rate of heat transfer is very efficient.

The heavy copper conducting plate rapidly conducts the heat outwardly to its flanges and then by direct thermal contact with the slots in the cooling bars, the heat is transferred thereto. The heat from the slots is transferred rapidly by conduction to the interior of the aluminum cooling bars where it is carried away by the evaporator tubes therein.

The cooling system according to the present invention thus provides improved cooling for high density packaging of electronic components.

I claim:

1. A cooling system for an electronic computer having removable chassis mounted modules, comprising:
    (a) a plurality of modules each comprising a heat conducting plate, a pair of electronic circuit board assemblies, and means for attaching said circuit board assemblies to opposite sides of said plate, said heat conducting plate being wider than said circuit board assemblies so that opposite edges of said plate form heat conducting flanges which extend beyond the edges of said circuit board assemblies;
    (b) a plurality of cooling bars forming a part of said chassis, said cooling bars having internal coolant flow passages and having faces with a plurality of slots formed therein removably receiving the heat conducting flanges of said modules;
    (c) means for mounting said cooling bars within said chassis in parallel relationship to each other with said slotted faces of adjacent cooling bars facing one another and spaced apart a distance corresponding to the width of said modules to define a plurality of positions for mounting said modules in said chassis;
    (d) clamping means connected to said cooling bars and operative when actuated to clamp said heat conducting flanges into heat conducting contact with said cooling bars via said slots;
    (e) actuation means operatively connected to said clamping means and operative in a first mode to positively release said clamping means to permit removal and replacement of modules and operative in a second mode to actuate said clamping means to positively clamp said flanges in said slots; and
    (f) means for supplying coolant fluid to said internal passages of said cooling bars.

2. A cooling system according to claim 1 wherein said clamping means comprises a plurality of pins attached to the faces of said cooling bars adjacent said slots, and wedging blocks slideably positioned on said pins, said wedging blocks having camming surfaces formed therein for engagement with said pins, and wherein said actuation means includes means for moving said wedge blocks along said pins so that said camming surfaces riding on said pins force said wedge blocks against the heat conducting flanges, thereby clamping the flanges in the slots.

3. A cooling system according to claim 2 wherein said wedging blocks have threaded holes tapped in their ends, and wherein said means for moving said wedge blocks includes jacking strips attached to the faces of said cooling bors having holes generally aligned with the holes in said wedging blocks, and bolts passing through the holes in said jacking strip and threaded into the wedging blocks, whereby flanges can be clamped by tightening said bolts.

4. A cooling system according to claim 1 wherein said circuit board assemblies and said plate have a plurality of aligned holes, and wherein said means for attaching said circuit board assemblies to opposite sides of said plate includes a plurality of studs passing through said aligned holes, spacer washers on said studs between said circuit board assemblies and said plate, and nuts on said spacers to hold said modules together.

5. A cooling system according to claim 4 wherein said circuit board assemblies include conductor pads around at least some of said aligned holes, and wherein said washers have serrated edges for establishing good electrical and thermal contact with said pads.

6. An improved cooling system for electronic apparatus comprising a plurality of removable circuit modules and a supporting chassis, said chassis including a plurality of cooling bars, said cooling bars having a plurality of slots formed therein, said cooling bars positioned adjacent one another and spaced apart according to the width of the circuit modules, the circuit modules having heat conducting flanges along sides thereof removably fitting into said slots, clamping means connected to said cooling bars and operative when actuated to clamp said flanges in said slots, actuation means operatively connected to said clamping means and operative in a first mode to positively release said clamping means to permit removal and replacement of modules and operative in a second mode to actuate said clamping means to positively clamp said flanges in said slots in heat conducting releation therewith so that heat generated within the modules is conducted to the cooling bars, said cooling bars having coolant flow passages for removing heat therefrom.

7. An improved cooling system according to claim 6 wherein said clamping means comprises a plurality of pins attached to the faces of said cooling bars adjacent said slots, and wedging blocks slideably positioned on said pins, said wedging blocks having camming surfaces formed therein for engagement with said pins, and wherein said actuation means includes means connected for moving said wedge block along said pins so that said camming surfaces riding on said pins force said wedge blocks against said heat conducting flanges, thereby clamping the flanges in the slots.

* * * * *